(12) United States Patent
Chiang

(10) Patent No.: US 12,235,169 B2
(45) Date of Patent: Feb. 25, 2025

(54) TEMPERATURE-SENSING CIRCUIT AND OPERATING METHOD THEREOF

(71) Applicant: Winbond Electronics Corp., Taichung (TW)

(72) Inventor: Ju-An Chiang, Hsinchu (TW)

(73) Assignee: WINBOND ELECTRONICS CORP., Taichung (TW)

( * ) Notice: Subject to any disclaimer, the term of this patent is extended or adjusted under 35 U.S.C. 154(b) by 607 days.

(21) Appl. No.: 17/565,179

(22) Filed: Dec. 29, 2021

(65) Prior Publication Data

US 2023/0204433 A1 Jun. 29, 2023

(51) Int. Cl.
| | |
|---|---|
| G01K 7/01 | (2006.01) |
| G01K 3/00 | (2006.01) |
| G01K 7/00 | (2006.01) |
| G01K 15/00 | (2006.01) |
| H03M 1/46 | (2006.01) |

(52) U.S. Cl.
CPC ............... G01K 7/00 (2013.01); G01K 3/005 (2013.01); G01K 7/01 (2013.01); G01K 15/005 (2013.01); H03M 1/46 (2013.01); G01K 2219/00 (2013.01)

(58) Field of Classification Search
CPC ............ H03M 1/46; H03M 2017/0806; G01K 3/005; G01K 7/00; G01K 7/01; G01K 15/005; G01K 15/00; G01K 2219/00
See application file for complete search history.

(56) References Cited

U.S. PATENT DOCUMENTS

| | | | | |
|---|---|---|---|---|
| 5,085,526 | A | * | 2/1992 | Sawtell ................. G01K 3/005 |
| | | | | 327/512 |
| 5,870,052 | A | | 2/1999 | Dedic et al. |
| 7,078,955 | B2 | * | 7/2006 | Kim ....................... G01K 7/01 |
| | | | | 327/512 |
| 9,116,052 | B2 | * | 8/2015 | Cao ......................... G01K 7/22 |
| 9,719,861 | B2 | | 8/2017 | Ramaraju et al. |

(Continued)

FOREIGN PATENT DOCUMENTS

CN 104348487 B 12/2018

*Primary Examiner* — Randy W Gibson
(74) *Attorney, Agent, or Firm* — Birch, Stewart, Kolasch & Birch, LLP

(57) ABSTRACT

A temperature-sensing circuit is provided, which includes: a search-control circuit, a voltage-reference circuit, a CTAT (complementary to absolute temperature) circuit, a digital-to-analog converter (DAC) circuit, a comparison circuit, and an SAR (successive approximation register) circuit. The search-control circuit generates a reference-voltage selection signal according to a plurality of control signals. The voltage-reference circuit selects a first reference voltage from a plurality of candidate reference voltages according to the reference-voltage selection signal, and provides a second reference voltage. The CTAT circuit converts the second reference voltage into a first comparison voltage. The DAC circuit converts the first reference voltage into a second comparison voltage. The comparison circuit compares the first comparison voltage and the second comparison voltage to generate a comparison-result signal. The SAR control circuit outputs each bit of a temperature-segment signal of an operating temperature according to the comparison-result signal. The control signals include the temperature-segment signal.

12 Claims, 8 Drawing Sheets

(56) References Cited

U.S. PATENT DOCUMENTS

| | | |
|---|---|---|
| 10,037,045 B2 | 7/2018 | Wan et al. |
| 10,190,922 B2 * | 1/2019 | Eberlein ................. G01K 7/01 |
| 10,367,518 B2 | 7/2019 | Lu et al. |
| 10,642,305 B2 | 5/2020 | Lee et al. |
| 11,269,365 B2 * | 3/2022 | Murakami ............. G05F 1/567 |
| 11,644,367 B2 * | 5/2023 | Michel ................... G01K 7/01 |
| | | 374/178 |
| 12,131,675 B2 * | 10/2024 | Kim ....................... G01K 7/20 |
| 2023/0152165 A1 * | 5/2023 | Singh ..................... G01K 7/01 |
| | | 374/163 |

* cited by examiner

| Ta °C | TSCODE [3] | [2] | [1] | [0] | Hex | |
|---|---|---|---|---|---|---|
| -40 | 0 | 0 | 0 | 0 | 0h | |
| -35 | | | | | | |
| -30 | 0 | 0 | 0 | 1 | 1h | |
| -25 | | | | | | Segment[1:0]=2'b00 |
| -20 | 0 | 0 | 1 | 0 | 2h | |
| -15 | | | | | | |
| -10 | 0 | 0 | 1 | 1 | 3h | |
| -5 | | | | | | |
| 0 | 0 | 1 | 0 | 0 | 4h | |
| 5 | | | | | | |
| 10 | 0 | 1 | 0 | 1 | 5h | |
| 15 | | | | | | Segment[1:0]=2'b01 |
| 20 | 0 | 1 | 1 | 0 | 6h | |
| 25 | | | | | | |
| 30 | 0 | 1 | 1 | 1 | 7h | |
| 35 | | | | | | |
| 40 | 1 | 0 | 0 | 0 | 8h | |
| 45 | | | | | | |
| 50 | 1 | 0 | 0 | 1 | 9h | |
| 55 | | | | | | Segment[1:0]=2'b10 |
| 60 | 1 | 0 | 1 | 0 | Ah | |
| 65 | | | | | | |
| 70 | 1 | 0 | 1 | 1 | Bh | |
| 75 | | | | | | |
| 80 | 1 | 1 | 0 | 0 | Ch | |
| 85 | | | | | | |
| 90 | 1 | 1 | 0 | 1 | Dh | |
| 95 | | | | | | |
| 100 | 1 | 1 | 1 | 0 | Eh | Segment[1:0]=2'b11 |
| 105 | | | | | | |
| 110 | 1 | 1 | 1 | 1 | Fh | |
| 115 | | | | | | |
| 120 | 1 | 1 | 1 | 1 | Fh | |
| 125 | | | | | | |

Rows 3001 covers -40 to -5; 3002 covers 0 to 35; 3003 covers 40 to 75; 3004 covers 80 to 125.

TEMPERATURE-SENSING CIRCUIT AND OPERATING METHOD THEREOF

BACKGROUND OF THE INVENTION

Field of the Invention

The present invention relates to temperature-sensing circuits and, in particular, to a temperature-sensing circuit and an operating method thereof for improving local non-linearity phenomenon of a temperature curve.

Description of the Related Art

Currently, integrated circuits used in different applications may be equipped with a temperature-sensing circuit to detect the operating temperature of the integrated circuits. For example, the temperature-sensing circuit may be configured to detect whether the operating temperature of the integrated circuit is too high, so as to activate the overheat-protection mechanism of the integrated circuit, thereby ensuring the optimal performance of the integrated circuit. However, due to complicated mutual impacts between the manufacturing process and simulation environments, the integrated circuit may face a local non-linearity in one or more operating-temperature segments, resulting in the inaccurate detection of the operating temperature of the integrated circuit.

BRIEF SUMMARY OF THE INVENTION

A detailed description is given in the following embodiments with reference to the accompanying drawings.

In an exemplary embodiment, a temperature-sensing circuit is provided. The temperature-sensing circuit includes: a search-control circuit, a voltage-reference circuit, a CTAT (complementary to absolute temperature) circuit, a digital-to-analog converter (DAC) circuit, a comparison circuit, and an SAR (successive approximation register) circuit. The search-control circuit generates a reference-voltage selection signal according to a plurality of control signals. The voltage-reference circuit selects a first reference voltage from a plurality of candidate reference voltages according to the reference-voltage selection signal, and provides a second reference voltage. The CTAT circuit converts the second reference voltage into a first comparison voltage. The DAC circuit converts the first reference voltage into a second comparison voltage. The comparison circuit compares the first comparison voltage and the second comparison voltage to generate a comparison-result signal. The SAR control circuit outputs each bit of a temperature-segment signal of an operating temperature of the temperature-sensing circuit according to the comparison-result signal. The control signals comprise the temperature-segment signal.

In another exemplary embodiment, an operation method of a temperature-sensing circuit is provided. The method includes the following steps: generating a reference-voltage selection signal according to a plurality of control signals; selecting a first reference voltage from a plurality of candidate reference voltages according to the reference-voltage selection signal, and providing a second reference voltage; converting the second reference voltage and the first reference voltage into a first comparison voltage and a second comparison voltage, respectively; comparing the first comparison voltage and the second comparison voltage to generate a comparison-result signal; and using a modified binary-search method to output each bit of a temperature-segment signal of an operating temperature of the temperature-sensing circuit according to the comparison-result signal, wherein the modified binary-search method dynamically increases or decreases a pre-search voltage range of the temperature-sensing circuit.

BRIEF DESCRIPTION OF THE DRAWINGS

The present invention can be more fully understood by reading the subsequent detailed description and examples with references made to the accompanying drawings, wherein:

FIG. 3A is a diagram of temperature segments in accordance with an embodiment of the invention;

DETAILED DESCRIPTION OF THE INVENTION

The following description is made for the purpose of illustrating the general principles of the invention and should not be taken in a limiting sense. The scope of the invention is best determined by reference to the appended claims.

Figure 1A:
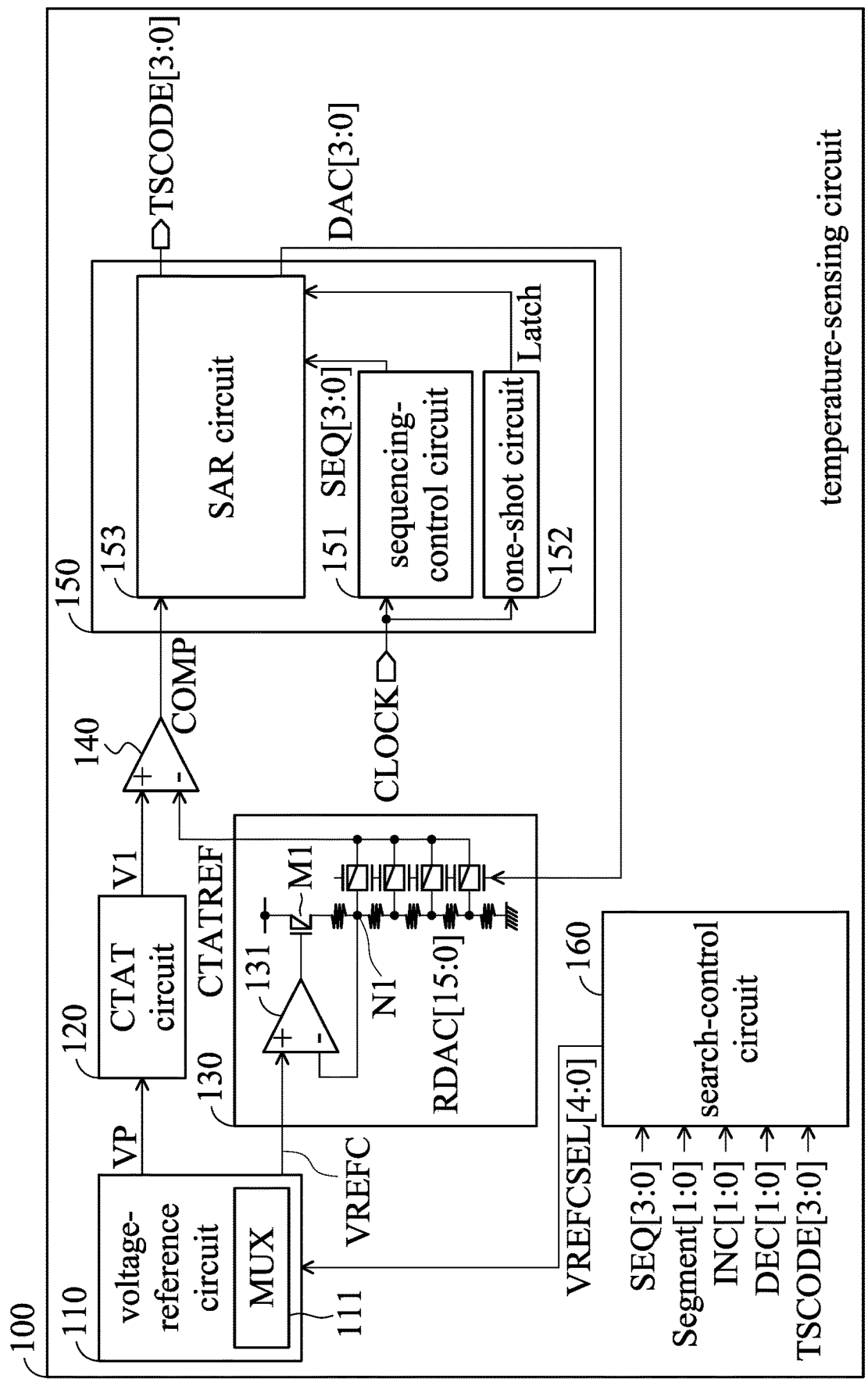
FIG. 1A is a block diagram of a temperature-sensing circuit in accordance with an embodiment of the invention.

FIG. 1A is a block diagram of a temperature-sensing circuit in accordance with an embodiment of the invention. As depicted in FIG. 1A, the temperature-sensing circuit 100 may include a voltage-reference circuit 110, a CTAT (complementary to absolute temperature) circuit 120, a DAC (digital-to-analog converter) circuit 130, a comparison circuit 140, an SAR (successive approximation register) control circuit 150, and a search-control circuit 160.

The voltage-reference circuit 100 may provide reference voltages VP and VREFC respectively to the CTAT circuit 120 and the DAC circuit 130 according to a reference-voltage selection signal VREFCSEL[4:0] generated by the search-control circuit 160. In some embodiments, the voltage-reference circuit 110 may be implemented by a bandgap voltage-reference circuit. For example, the voltage-reference circuit 110 may provide a plurality of candidate reference voltages, and the voltage-reference circuit 110 may include a multiplexer 111 that is configured to select output reference voltages VP and VREFC from the candidate reference voltages according to the reference-voltage selection signal VREFCSEL[4:0].

The CTAT circuit 120 may receive the reference voltage VP provided by the voltage-reference circuit 110, and convert the reference voltage VP into a first comparison voltage V1. In some embodiments, the effective temperature detection range of the temperature-sensing circuit 100 may be between −40° C. and 120° C. When the operating temperature of the temperature-sensing circuit 100 is higher, the first comparison voltage V1 generated by the CTAT circuit 120 is lower. When the operating temperature of the temperature-sensing circuit 100 is lower, the first comparison voltage V1 generated by the CTAT circuit 120 is higher.

The DAC circuit 130, for example, may be implemented by a resistive DAC. The DAC circuit 130 may generate a second comparison voltage CTATREF according to a digital-to-analog conversion signal DAC[3:0] from the SAR-control circuit 150, and the first comparison voltage V1 and the second comparison voltage CTATREF are input to the comparison circuit 140 to generate a comparison result COMP. Specifically, the positive input terminal of the operational amplifier 131 of the DAC 130 may receive the reference voltage VREFC from the voltage-reference circuit 110, and the voltages on the positive input terminal and the negative input terminal of the operational amplifier 131 are equal. Thus, the reference voltage VREFC can be obtained at node N1. The transistor M1 may provide an operating current to the resistor ladder of the DAC circuit 130.

It should be noted that the number of resistors and the number of corresponding switch circuits in the resistor ladder of the DAC circuit 130 are for description. The reference voltage VREFC at node N1 may generate corresponding resistive digital-to-analog signal RDAC[15:0] at different nodes of the resistive ladder, and the output voltage of each bit of the resistive digital-to-analog signal RDAC [15:0] is connected to the corresponding switch circuit, wherein turning on or off of each switch circuit is controlled by the corresponding bit in the resistive digital-to-analog conversion signal DAC[15:0]. Accordingly, the DAC circuit 130 may generate the second comparison voltage CTATRF according to the digital-to-analog conversion signal DAC [3:0].

For example, when the first comparison voltage V1 is higher than or equal to the second comparison voltage CTATREF, the comparison-result signal COMP generated by the comparison circuit 140, for example, may be in a high-logic state. When the first comparison voltage V1 is lower than the second comparison voltage CTATREF, the comparison-result COMP generated by the comparison circuit 140, for example, may be in a low-logic state.

Figure 1B:
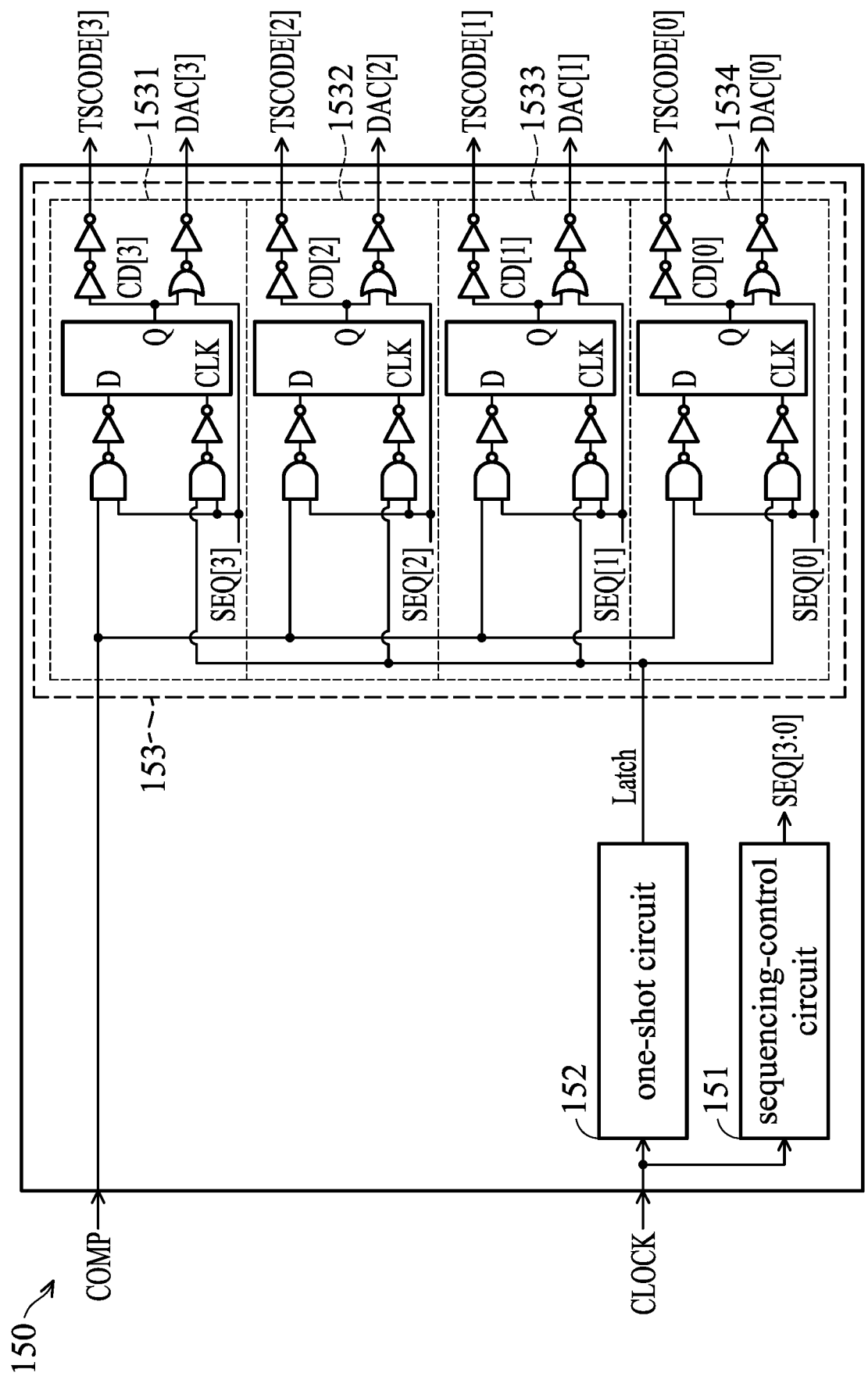
FIG. 1B is a diagram of the SAR control circuit in accordance with the embodiment of FIG. 1A.

FIG. 1B is a diagram of the SAR control circuit in accordance with the embodiment of FIG. 1A. Please refer to both FIG. 1A and FIG. 1B.

The SAR control circuit 150, for example, may be regarded as a digital-to-analog conversion (DAC) circuit. The SAR control circuit 150 may include a sequencing-control circuit 151, a one-shot circuit 152, and a SAR circuit 153. The sequencing-control circuit 151 may receive a clock signal CLOCK, and sequentially generate a corresponding sequencing-control signal SEQ[3:0] that is used to indicate the detection sequence and progress of the temperature-segment signal TSCODE[3:0]. For example, the sequencing-control signal SEQ[3:0] generated by the sequencing-control circuit 151 can be represented by a one-hot code, and the sequence is 1000, 0100, 0010, and 0001, respectively, to indicate the temperature-segment signal TSCODE[3], TSCODE[2], TSCODE[1], and TSCODE[0]. The one-shot circuit 152 may also receive the clock signal CLOCK, and convert the clock signal CLOCK signal into a latch signal Latch.

The SAR circuit 153 may sequentially output each bit of the temperature-segment signal TSCODE[3:0] and the digital-to-analog conversion signal DAC[3:0] (e.g., from the highest bit to the lowest bit) according to the comparison signal COMP, the sequencing-control signal SEQ[3:0] from the sequencing-control circuit 151, and the latch signal Latch from the one-shot circuit 152. For example, when the sequencing-control signal SEQ[3:0]=4'b1000, it indicates that the sequencing-control signal SEQ[3]=1'1. Accordingly, a clock signal will be input to the clock input terminal CLK of the D flip-flop in the control circuit 1531 in the uppermost portion of the SAR circuit 153 for operation, and the output terminal Q of the D flip-flop will generate a comparison-delay signal CD[3]. The temperature-segment signal TSCODE[3] can be obtained by the comparison-delay signal CD[3] passing through two inverters, wherein the temperature-segment signal TSCODE[3] may be stored in a register (not shown). After the comparison-delay signal CD[3] and the sequencing-control signal SEQ[3] pass through a NOR gate and an inverter, the digital-to-analog conversion signal DAC[3] can be obtained. The operations of the control circuits 1532 to 1534 are similar to that of the control circuit 1531, so no further description will be provided here. In brief, the SAR circuit 153 may sequentially output each bit of the temperature-segment signal TSCODE[3:0] according to the comparison-result signal COMP.

The search-control circuit 160 may generate the reference-voltage-selection signal VREFSEL[4:0] according to the sequencing-control circuit SEQ[3:0], the temperature-segment signal TSCODE[3:0], a segment signal Segment [1:0], an increment-control signal INC[1:0], and a decrement-control signal DEC[1:0]. In some embodiments, setting values of the segment signal Segment[1:0], increment-control signal INC[1:0] and the decrement-control signal DEC[1:0] can be pre-stored in a read-only memory (ROM) or other types of non-volatile memory in the temperature-sensing circuit 100. The segment signal Segment [1:0], increment signal INC[1:0], and decrement signal DEC[1:0], for example, may be external signals of the temperature-sensing circuit 100, and can be set by the user. In some other embodiments, the search-control circuit 160 may include a lookup table (not shown), the input of which is the sequencing-control signal SEQ[3:0], the temperature-segment signal TSCODE[3:0], the segment signal Segment [1:0], the increment-control signal INC[1:0], and the decrement-control signal DEC[1:0], where the output of the lookup table is the reference-voltage-selection signal VREFCSEL[4:0]. The lookup table may be implemented by a programmable logic array (PLA), a complex programmable logic device (CPLD), a processor, a microcontroller, an application-specific integrated circuit (ASIC), or other circuits having the same logic function.

For example, the segment signal Segment[1:0] is used to define different temperature segments. Taking the 2-bit segment signal Segment[1:0] as an example, a total of 4 combinations of temperature segments can be defined. As shown in FIG. 3A, when the segment signal Segment[1:0] are 2'b00, 2'b01, 2'b10, and 2'b11, the search-control circuit 160 can determine whether to use the modified binary search method on the temperature segments 3001, 3002, 3003, and 3004, respectively. For example, the temperature segment 3001 may represent the temperature range from −5 degrees Celsius to −40 degrees Celsius (e.g., it can be regarded as a low-temperature segment), and the temperature segment 3002 may represent the temperature range from 0 degrees Celsius to 35 degrees Celsius. The temperature segment 300 may represent the temperature range from 40 degrees Celsius to 75 degrees Celsius, and the temperature segment 3004 may represent a temperature range of 80 degrees Celsius to 120 degrees Celsius or higher (e.g., it can be regarded as a high-temperature segment). It should be noted that the invention is not limited to the aforementioned implementation methods, and those having ordinary skill in the art can set the number of temperature segments and the corresponding temperature ranges according to actual needs.

The increment-control signal INC[1:0] and the decrement-control signal DEC[1:0] are used for increasing or decreasing amplitude magnification factor of the first reference voltage within the temperature segment indicated by the segment signal Segment[1:0]. For example, when the increment-control signal INC[1:0] is 2'b00 or 2'b11, the temperature-sensing circuit 100 does not adjust the temperature segment indicated by the segment signal Segment[1:0]. This means that the reference voltage VREFC provided by the voltage-reference circuit 110 to the DAC circuit 130 is not changed. When the increment-control signal INC[1:0] is 2'b01, the reference voltage VREFC provided by the voltage-reference circuit 110 to the DAC circuit 130 will increase, for example, by 2.1%. When the increment-control signal INC[1:0] is 2'b10, the reference voltage VREFC provided by the voltage-reference circuit 110 to the DAC circuit 130 will increase, for example, by 4.2%.

When the decrement-control signal DEC[1:0] is 2'b00 or 2'b11, the temperature-sensing circuit 100 does not adjust the temperature segment indicated by the segment signal Segment[1:0]. This means that the reference voltage VREFC provided by the voltage-reference circuit 110 to the DAC circuit 130 is not changed. When the decrement-control signal DEC[1:0] is 2'b01, the reference voltage VREFC provided by the voltage-reference circuit 110 to the DAC circuit 130 will decrease, for example, by 2.1%. When the increment-control signal INC[1:0] is 2'b10, the reference voltage VREFC provided by the voltage-reference circuit 110 to the DAC circuit 130 will decrease, for example, by 4.2%. It should be noted that the invention is not limited to the ratio of increasing or decreasing the reference voltage VREFC in the aforementioned embodiments. Those having ordinary skill in the art of the invention can adjust the adjustment ratio of the reference voltage VREFC according to actual needs.

Figure 2:
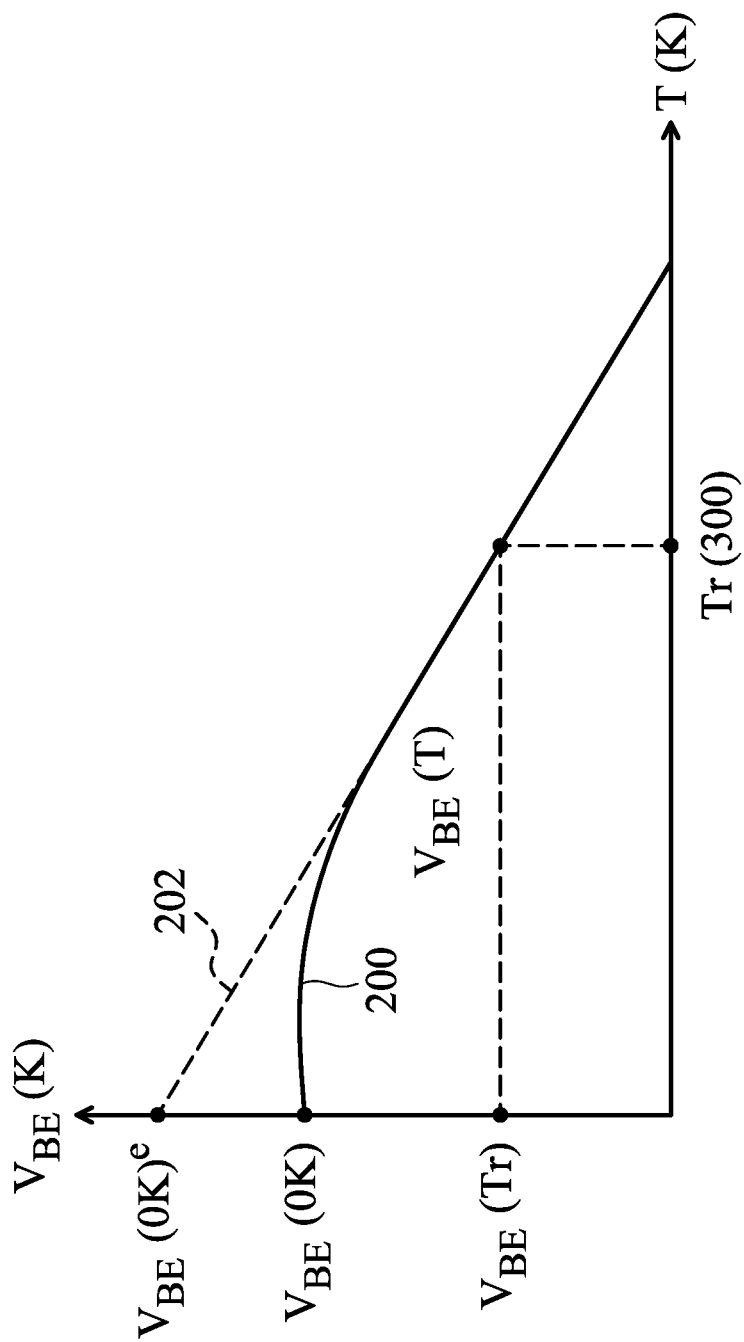
FIG. 2 is a diagram of a reference-voltage curve generated by the voltage-reference circuit.

FIG. 2 is a diagram of a reference-voltage curve generated by the voltage-reference circuit. The binary-search method used in the conventional temperature-sensing circuit is to divide the voltage range corresponding to the operating temperature range to be searched equally according to the number of binary bits. When the operating temperature of the integrated circuit is higher than a predetermined temperature threshold VBE(T), the reference voltage generated by the voltage-reference circuit will have a linear relationship with the temperature, such as curve 200. However, when the operating temperature of the integrated circuit is lower than the predetermined temperature threshold VBE(T), the reference voltage generated by the voltage-reference circuit will also be misaligned due to local non-linearity. When the operating temperature of the voltage reference circuit is 300K, the voltage generated by the voltage-reference circuit is VBE(Tr). However, curve 200 is not actually a linear relationship of a straight line. When the operating temperature of the voltage-reference circuit is 0K, the voltage generated by the voltage-reference circuit is VBE(0K). If curve 202 is used to estimate the voltage generated by the voltage-reference circuit, the voltage VBE(0K)e is obtained. Accordingly, the conventional temperature-sensing circuit is prone to detect temperature misalignment at low temperatures.

In an embodiment, the temperature-sensing circuit 100 may adopt a modified binary-search method to express the voltage range corresponding to the operating temperature range to be searched in a limited number of binary bits, where the aforementioned modified binary-search method is different from the conventional binary-search method. For example, during the temperature-detection process of the temperature-sensing circuit 100, the pre-search voltage range can be dynamically increased (i.e., enlarged) or decreased (i.e., shrunk), which means that each temperature segment in the temperature-segment signal TSCODE[3:0] does not need to be averaged. In addition, the temperature-sensing circuit 100 dynamically increases or decreases the specific temperature range based on the special temperature. For example, a high-temperature situation may indicate that the operating temperature of the temperature-sensing circuit 100 is higher than the temperature T1, and a low-temperature situation may indicate that the operating temperature of the temperature-sensing circuit 100 is lower than the temperature T2, wherein the temperature T1 is higher than the temperature T2. The details of the modified binary-search method adopted by the temperature-sensing circuit 100 will be described in detail in the following embodiments.

Figure 3B:
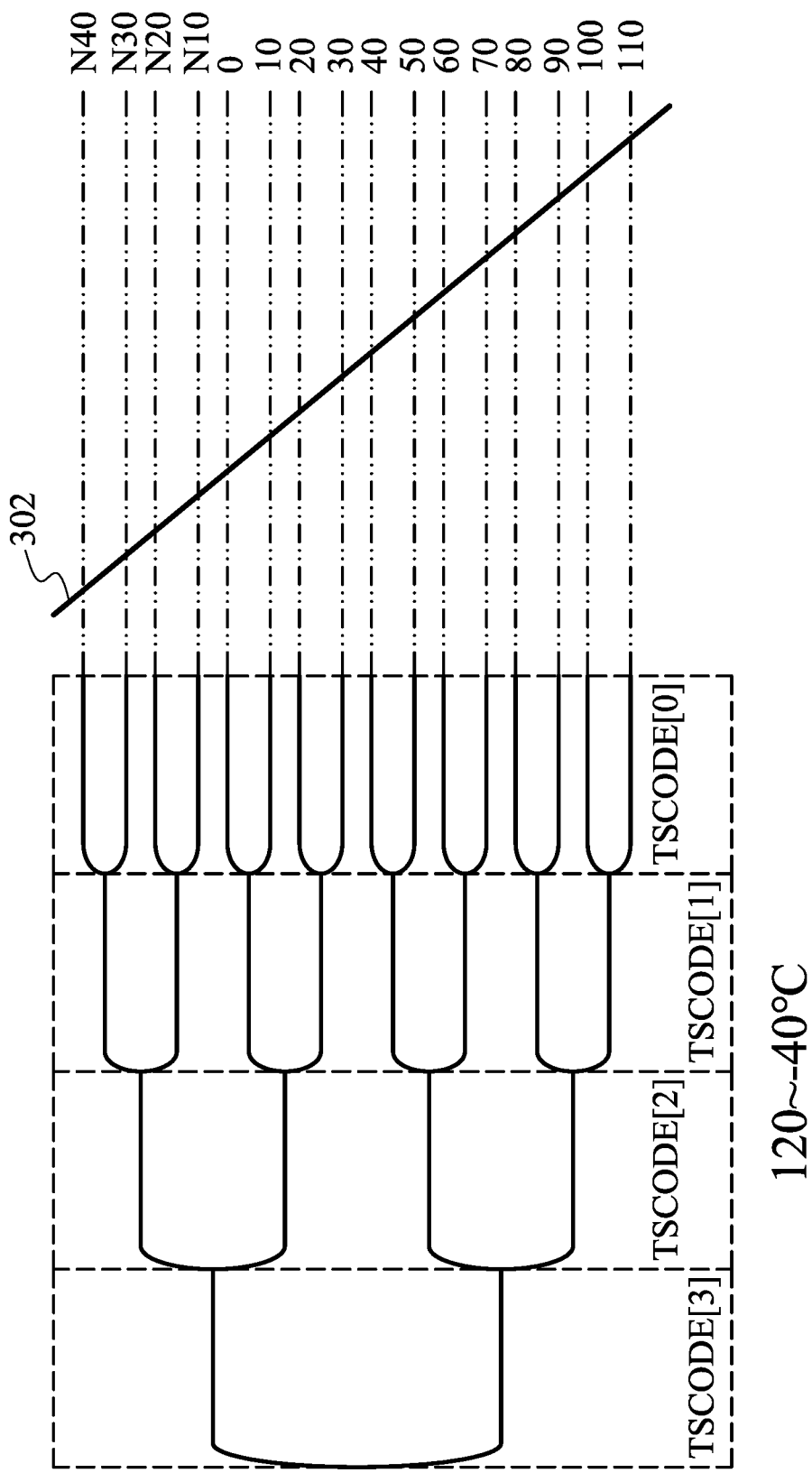
FIG. 3B is a diagram of a common binary-search method in accordance with an embodiment of the invention.
Figure 3C:
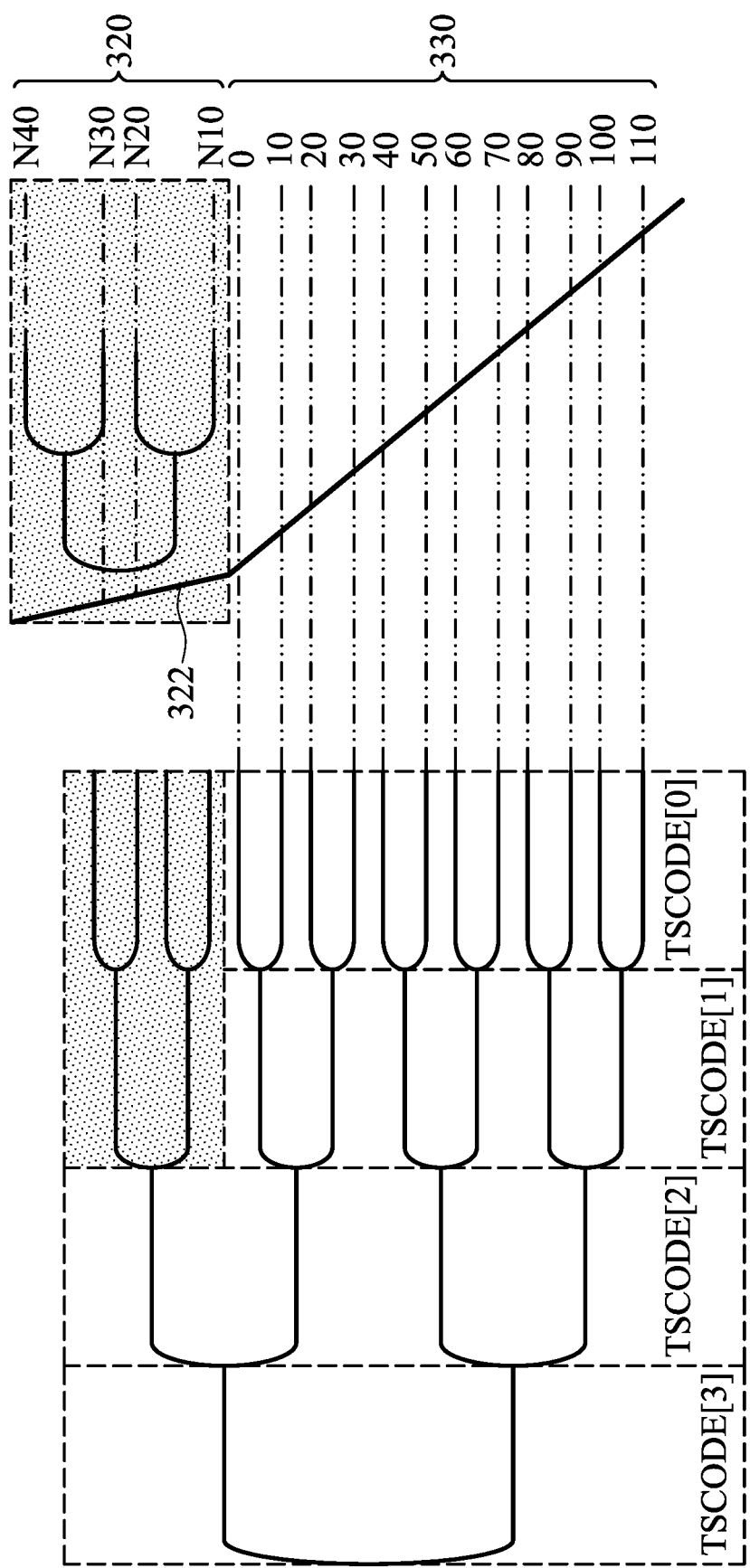
FIGS. 3C and 3D are diagrams of the modified binary-search method in accordance with an embodiment of the invention.
Figure 3D:
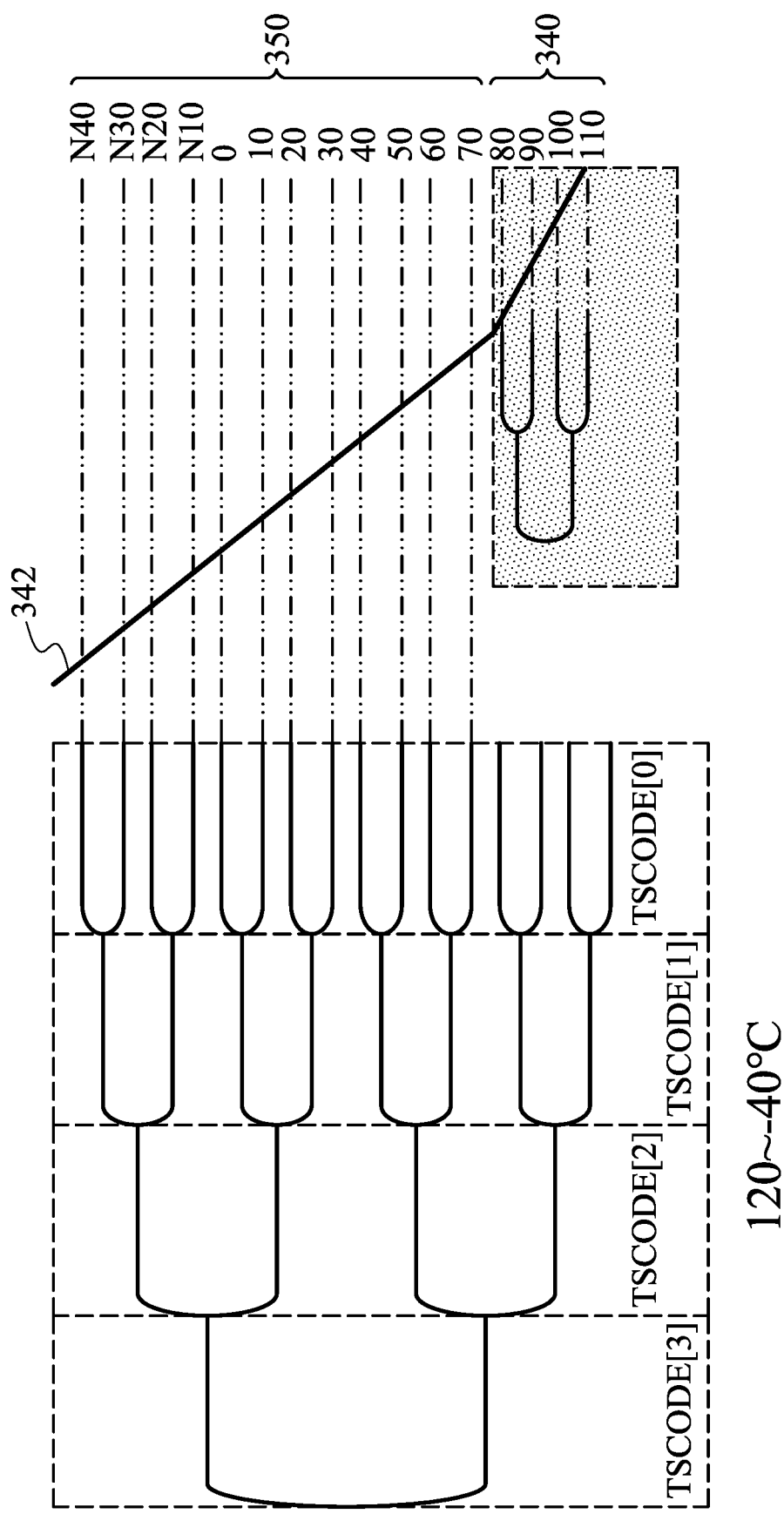

FIG. 3A is a diagram of temperature segments in accordance with an embodiment of the invention. FIG. 3B is a diagram of a common binary-search method in accordance with an embodiment of the invention. FIGS. 3C and 3D are diagrams of the modified binary-search method in accordance with an embodiment of the invention. Please refer to FIG. 1A and FIGS. 3A~3D.

FIG. 3A shows the temperature-segment table 300, wherein each value of the temperature-segment signal TSCODE[3:0] has a corresponding temperature Ta and its hexadecimal value Hex. In FIG. 3B, the value on the right represents the temperature in degrees Celsius. N10, N20, N30, and N40 represent −10 degrees, −20 degrees, −30 degrees, and −40 degrees Celsius, respectively. It is assumed that the operating-temperature range of the temperature-sensing circuit 100 is between −40 degrees Celsius and 120 degrees Celsius, and the first comparison voltage V1 generated by the CTAT circuit 120 linearly inversely proportional to the operating temperature, as shown by curve 302. Because the temperature-sensing circuit 100 uses the 4-bit temperature-segment signal TSCODE[3:0] and the binary-search method, it takes 4 clock cycles to determine the final value of the temperature-segment signal TSCODE[3:0] in each cycle of determining the temperature segment, as shown in the left portion of FIG. 3B.

For example, in the cycle of determining the temperature interval, the most significant bit (MSB) TSCODE[3] of the temperature-segment signal TSCODE[3:0] will be determined in the first clock cycle, and the second most significant bit TSCODE[2] of the temperature-segment TSCODE[3:0] will be determined in the second clock cycle. The second least significant bit TSCODE[1] of the temperature-segment signal TSCODE[3:0] will be determined in the third clock cycle, and the least significant bit TSCODE[0] of the temperature-segment signal TSCODE[3:0] will be determined in the fourth clock cycle.

After every four clock cycles have passed and the value of the temperature-segment signal TSCODE[3:0] is determined, the temperature-sensing circuit 100 can determine which temperature segment the current operating temperature is in. For example, when the temperature-segment signal TSCODE[3:0]=4'b0000 (or hexadecimal code Hex=0h), the temperature-sensing circuit can know that the current operating temperature Ta is approximately below −40 degrees Celsius. When the temperature-segment signal TSCODE[3:0]=4'b1111 (or hexadecimal code Hex=Fh), the temperature-sensing circuit 100 can know that the current operating temperature Ta is approximately about 120 degrees Celsius or above. When the temperature-segment signal TSCODE[3:0]=4'b0100 (or hexadecimal code Hex=4h), the temperature-sensing circuit 100 can know that the current operating temperature Ta is about 0 degrees Celsius. When the temperature-segment signal TSCODE[3:

0]=4'b1000 (or hexadecimal code Hex=8h), the temperature-sensing circuit 100 can know that the current operating temperature Ta is about 40 degrees Celsius, and so on. It should be noted that, for convenience of description, in the embodiment of FIG. 3A, each temperature segment is equally divided.

In the embodiment of FIG. 3C, the temperature-sensing circuit 100 uses the modified binary-search method to modify the temperature segment in the low-temperature region. For example, due to certain factors, when the operating temperature of the temperature-sensing circuit 100 is in the low-temperature region 320, curve 322 of the relationship between the first comparison voltage V1, which is generated by the CTAT circuit 120, and the temperature may be equivalently or actually become steeper.

In the cycle of determining the temperature segment, the most two significant bits TSCODE[3:2] of the temperature-segment signal TSCODE can be determined after two clock cycles have passed. When the temperature-segment signal TSCODE[3:2]=1'b00, it means that the operating temperature of the temperature-sensing circuit 100 will be located in the low-temperature region 320 (e.g., lower than −10 degrees Celsius). At this time, the temperature-sensing circuit 100 can correct the temperature segment in the low-temperature region 320, for example, the search voltage range can be increased (or decreased), and the increased (or decreased) search voltage range does not overlap with the original search voltage range. In this embodiment, when the temperature-segment signal TSCODE[3:2] is not equal to 2'b00, it means that the operating temperature of the temperature-sensing circuit 100 will be in the normal-temperature region 330 (e.g., between −10 degrees Celsius and 120 degrees Celsius), and at this time, the temperature-sensing circuit 100 does not modify the search voltage range of any temperature segment. For example, the search can be perform according to the equidistant temperature segment shown in FIG. 3A. It should be noted that the embodiment in FIG. 3C is used to illustrate that the temperature-sensing circuit 100 can amplify the temperature segment in the low-temperature region 320, but the invention is not limited to the aforementioned embodiment. The temperature-sensing circuit 100 may also modify (e.g., including increasing and decreasing) the temperature segment in the corresponding temperature region according to the predetermined temperature-segment signal TSCODE.

Figure 4:
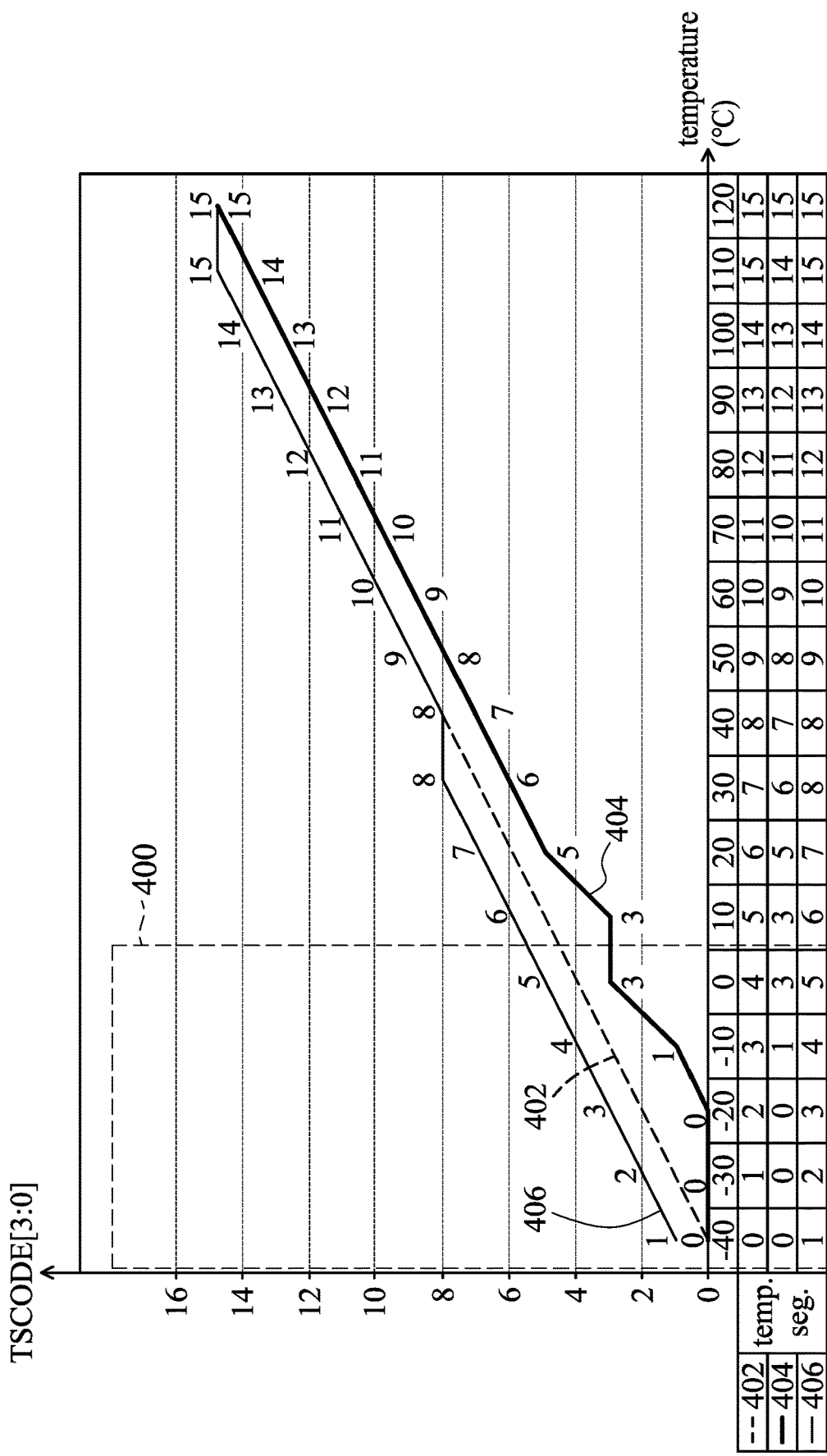
FIG. 4 is a diagram of adjusting the temperature curve of the temperature-sensing circuit in accordance with an embodiment of the invention.

FIG. 4 is a diagram of adjusting the temperature curve of the temperature-sensing circuit in accordance with an embodiment of the invention. The table in the bottom portion of FIG. 4 shows the temperature-segment values of curves 402, 404, 406 at various temperatures, and the temperature-segment values can refer to the representation in FIG. 3A. Curve 404 may represent the temperature curve of the temperature-sensing circuit 100 when the modified binary-search method is not used to adjust the reference voltage VREFC generated by the voltage-reference circuit 110, wherein the reference voltage VREFC, for example, is 1.2V in the low-temperature region (e.g., block 400 corresponding to the segment signal Segment[1:0]=2'b00). When the operating temperature of the temperature-sensing circuit 100 is respectively −40 degrees Celsius, −30 degrees Celsius, and −20 degrees Celsius, curve 404 is located in the temperature segment 0. When the operating temperature of the temperature-sensing circuit 100 is −10 degrees Celsius and 0 degrees Celsius, curve 404 is located in the temperature segments 1 and 3, respectively, which means that the temperature segment 2 is skipped. When the operating temperature of the temperature-sensing circuit 100 is 10 degrees Celsius and 20 degrees Celsius, curve 404 is located in the temperature segments 3 and 5, respectively. In other words, when the curve 404 is in the low-temperature region, as the operating temperature linearly increases or decreases, the corresponding temperature segment does not show a linear relationship.

Curve 402 represents an ideal linear temperature curve, which is the design goal of the temperature-sensing circuit 100. It means that when curve 402 is within the operating-temperature range, as the operating temperature linearly increases or decreases, its corresponding temperature segment shows a linear relationship.

Curve 406 represent the temperature curve when the temperature-sensing circuit 100 uses the modified binary-search method to adjust the reference voltage VREFC generated by the voltage-reference circuit 110. For example, the designer of the temperature-sensing circuit 100 can measure curve 404 of the temperature-sensing circuit 100 in advance when the modified binary-search method is not used, and can target temperature segments with severe nonlinear misalignment (e.g., low-temperature region, high-temperature region, or other designated temperature region) to adjust the reference voltage VREFC, so that the corrected temperature curve of the temperature-sensing circuit 100 can better fit the ideal temperature curve (e.g., curve 402), which means that the accuracy of detecting the operating temperature of temperature-sensing circuit 100 can be improved.

In view of the above, a temperature-sensing circuit and an operation method thereof are provided, which can use the modified binary-search method to adjust the temperature curve of the reference voltage generated by the voltage-reference circuit, and can target temperature segments with severe nonlinear misalignment (e.g., low-temperature region, high-temperature region, or other designated temperature region) to adjust the reference voltage, so that the corrected temperature curve of the temperature-sensing circuit can better fit the ideal temperature curve, thereby improving the accuracy of detecting the operating temperature of temperature-sensing circuit 100.

What is claimed is:

1. A temperature-sensing circuit, comprising:
   a search-control circuit, configured to generate a reference-voltage selection signal according to a plurality of control signals;
   a voltage-reference circuit, configured to select a first reference voltage from a plurality of candidate reference voltages according to the reference-voltage selection signal, and provide a second reference voltage;
   a CTAT (complementary to absolute temperature) circuit, configured to convert the second reference voltage into a first comparison voltage;
   a digital-to-analog converter circuit, configured to convert the first reference voltage into a second comparison voltage;
   a comparison circuit, configured to compare the first comparison voltage and the second comparison voltage to generate a comparison-result signal; and
   an SAR (successive approximation register) control circuit, configured to output each bit of a temperature-segment signal of an operating temperature of the temperature-sensing circuit according to the comparison-result signal,
   wherein the control signals comprise the temperature-segment signal.

2. The temperature-sensing circuit as claimed in claim 1, wherein the voltage-reference circuit is a bandgap voltage reference circuit.

3. The temperature-sensing circuit as claimed in claim 2, wherein the voltage-reference circuit comprises a multiplexer to select the first reference voltage from the candidate reference voltages according to the reference-voltage selection signal.

4. The temperature-sensing circuit as claimed in claim 1, wherein the SAR control circuit uses a modified binary-search method to sequentially output each bit of the temperature-segment signal,
wherein during the sequential outputting of each bit of the temperature-segment signal, when one or more predetermined most significant bits in the temperature-segment signal meet a predetermined condition, the search-control circuit changes the reference-voltage selection signal to control the voltage-reference circuit to adjust the first reference voltage.

5. The temperature-sensing circuit as claimed in claim 4, wherein the control signals further comprise a sequencing-control signal, a segment signal, an increment-control signal, and a decrement-control signal,
wherein the sequencing-control signal controls order of each bit of the temperature-segment signal, and the segment signal indicates a specific temperature region to be adjusted in the temperature-sensing circuit,
wherein the increment-control signal and the decrement-control signal represent increasing and decreasing an amplitude magnification factor of the first reference voltage.

6. The temperature-sensing circuit as claimed in claim 5, wherein the predetermined condition indicates that one or more most significant bits in the temperature-segment signal comply with the segment signal.

7. The temperature-sensing circuit as claimed in claim 5, wherein the search-control circuit comprises a lookup table for recording relationships between the sequencing-control signal, the segment signal, the increment-control signal, the decrement-control signal, and the reference-voltage selection signal.

8. The temperature-sensing circuit as claimed in claim 7, wherein the lookup table is implemented by a programmable logic array, a complex programmable logic device, a processor, a microcontroller, or an application-specific integrated circuit.

9. The temperature-sensing circuit as claimed in claim 1, wherein the SAR control circuit comprises a sequencing-control circuit, a one-shot circuit, and an SAR circuit,
wherein the one-shot circuit receives a clock signal to generate a latch signal, and the sequencing-control circuit receives the clock signal to sequentially generate the sequencing-control signal corresponding to each bit of the temperature-segment signal.

10. The temperature-sensing circuit as claimed in claim 9, wherein the SAR circuit generates the temperature-segment signal and a digital-to-analog conversion signal according to the comparison-result signal, the sequencing-control signal, and the latch signal.

11. The temperature-sensing circuit as claimed in claim 10, wherein the digital-to-analog conversion signal is input to the digital-to-analog converter circuit to convert the first reference voltage into the second comparison voltage.

12. The temperature-sensing circuit as claimed in claim 1, wherein the digital-to-analog converter circuit is a resistive digital-to-analog converter circuit.

* * * * *